United States Patent
Kwon et al.

(10) Patent No.: US 11,520,245 B2
(45) Date of Patent: Dec. 6, 2022

(54) APPARATUS AND METHOD FOR PROCESSING SUBSTRATE

(71) Applicant: SEMES Co., Ltd., Chungcheongnam-do (KR)

(72) Inventors: Oh Jin Kwon, Chungcheongnam-do (KR); Ji Su Hong, Chungcheongnam-do (KR); Sun Mi Kim, Jeollanam-do (KR)

(73) Assignee: Semes Co., Ltd., Chungcheongnam-do (KR)

( * ) Notice: Subject to any disclaimer, the term of this patent is extended or adjusted under 35 U.S.C. 154(b) by 0 days.

(21) Appl. No.: 17/404,240

(22) Filed: Aug. 17, 2021

(65) Prior Publication Data
US 2022/0206399 A1  Jun. 30, 2022

(30) Foreign Application Priority Data
Dec. 29, 2020 (KR) ........................ 10-2020-0186075

(51) Int. Cl.
*G03F 7/20* (2006.01)

(52) U.S. Cl.
CPC ...... *G03F 7/70875* (2013.01); *G03F 7/70058* (2013.01)

(58) Field of Classification Search
CPC .................. G03F 7/70875; G03F 7/70058
USPC ............................................. 355/30, 72–76
See application file for complete search history.

(56) References Cited

U.S. PATENT DOCUMENTS

| | | | |
|---|---|---|---|
| 7,926,441 B2 * | 4/2011 | Tsutsumi | H01L 21/67225 414/941 |
| 8,574,369 B2 | 11/2013 | Miura | |
| 8,918,303 B2 * | 12/2014 | Timans | G01J 5/53 702/99 |
| 9,553,003 B2 * | 1/2017 | Hayashi | H01L 21/67034 |
| 2008/0176002 A1 * | 7/2008 | Tsutsumi | G03F 1/80 427/508 |
| 2012/0257181 A1 | 10/2012 | Funabashi et al. | |
| 2014/0144464 A1 * | 5/2014 | Kaneko | H01L 21/67046 134/4 |

(Continued)

FOREIGN PATENT DOCUMENTS

| | | |
|---|---|---|
| JP | 06034244 U | 5/1994 |
| JP | 2000070885 A | 3/2000 |
| JP | 2002280339 A | 9/2002 |

(Continued)

OTHER PUBLICATIONS

Japanese Notice of Reasons for Refusal for Japanese Application No. 2021-128158, dated Sep. 20, 2022, with translation, 8 pages.

*Primary Examiner* — Hung V Nguyen
(74) *Attorney, Agent, or Firm* — RatnerPrestia

(57) ABSTRACT

A substrate processing apparatus and method for effectively removing an organic material such as a photoresist without using sulfuric acid are provided. The substrate processing apparatus includes a support module, in which a substrate is inverted and seated, and an ultraviolet light source is installed, wherein the substrate is arranged so that one surface of the substrate faces the support module, and the ultraviolet light source irradiates ultraviolet rays to one surface of the substrate; a nozzle installed in the support module; and a fluid supply module for supplying a fluid to one surface of the substrate through the nozzle.

20 Claims, 7 Drawing Sheets

(56) References Cited

U.S. PATENT DOCUMENTS

2018/0254201 A1    9/2018   Funabashi et al.
2020/0075355 A1    3/2020   Kwon et al.

FOREIGN PATENT DOCUMENTS

| | | |
|---|---|---|
| JP | 2012209559 A | 10/2012 |
| JP | 2014016305 A | 1/2014 |
| KR | 101214643 B1 | 12/2012 |
| KR | 101648946 B1 | 9/2016 |
| KR | 102099433 B1 | 4/2020 |

\* cited by examiner

APPARATUS AND METHOD FOR PROCESSING SUBSTRATE

CROSS REFERENCE TO RELATED APPLICATION

This application claims the benefit of Korean Patent Application No. 10-2020-0186075, filed on Dec. 29, 2020, in the Korean Intellectual Property Office, the disclosure of which is incorporated herein by reference in its entirety.

FIELD OF THE INVENTION

The present invention relates to a substrate processing apparatus and method.

DESCRIPTION OF THE RELATED ART

When manufacturing a semiconductor device or a display device, a photoresist pattern is used for etching. That is, a photoresist pattern is formed on the etched layer through a photo and developing process, and the etched layer is etched using the photoresist pattern. Then, the unnecessary photoresist pattern is removed through a strip process.

SUMMARY OF THE INVENTION

However, in the strip process, a sulfuric acid-based SPM solution (a mixture of $H_2SO_4$ and $H_2O_2$) or DSP (a mixture of $H_2SO_4$, HF and $H_2O_2$) is mainly used. However, taking the SPM solution as an example, the intermediate product ($H_2SO_5$) produced by the reaction of $H_2SO_4$ and $H_2O_2$ has high reactivity and produces water, so the concentration of the SPM solution is diluted. Therefore, it is necessary to continuously supply the SPM solution, and as the amount of the SPM solution increases, the amount of wastewater increases, and thus the cost of treating wastewater increases.

An aspect of the present invention is a substrate processing apparatus and method for effectively removing an organic material such as a photoresist without using sulfuric acid.

The problems of the present invention are not limited to the problems mentioned above, and other problems not mentioned will be clearly understood by those skilled in the art from the following description.

One aspect of the substrate processing apparatus of the present invention for achieving the above object comprises a support module, in which a substrate is inverted and seated, and an ultraviolet light source is installed, wherein the substrate is arranged so that one surface of the substrate faces the support module, and the ultraviolet light source irradiates ultraviolet rays to one surface of the substrate; a nozzle installed in the support module; and a fluid supply module for supplying a fluid to one surface of the substrate through the nozzle.

Another aspect of the substrate processing apparatus of the present invention for achieving the above object comprises a chamber; an inversion module installed in the chamber and for inverting a substrate; a support module installed in the chamber, in which a substrate inverted by the inversion module is seated, and an ultraviolet light source is installed, wherein one surface of the inverted substrate faces the support module, and the ultraviolet light source irradiates ultraviolet rays to one surface of the inverted substrate; a fluid supply module including a nozzle installed in the support module and for supplying a fluid to one surface of the inverted substrate through the nozzle; and a heating module arranged to be spaced apart from the support module in an upward direction and including an infrared light source for irradiating infrared rays to a rear surface of the inverted substrate.

One aspect of the substrate processing method of the present invention for achieving the above object comprises inverting and seating a substrate on a support module, wherein the substrate is arranged so that one surface of the substrate faces the support module, and supplying a fluid to one surface of the substrate while irradiating ultraviolet rays to one surface of the substrate to process the substrate.

The details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE INVENTION

Figure 1:
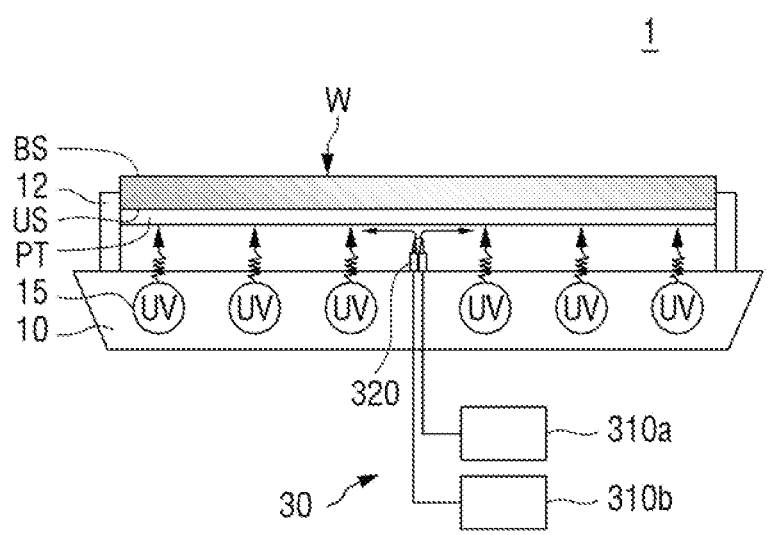
FIG. 1 is a conceptual diagram for describing a substrate processing apparatus according to a first embodiment of the present invention.

Hereinafter, preferred embodiments of the present invention will be described in detail with reference to the accompanying drawings. Advantages and features of the present invention, and methods for achieving them will be clarified with reference to embodiments described below in detail together with the accompanying drawings. However, the present invention is not limited to the embodiments disclosed below, but may be implemented in various different forms, and only the embodiments allow the publication of the present invention to be complete, and are provided to fully inform those skilled in the technical field to which the present invention pertains of the scope of the invention, and the invention is only defined by the scope of the claims. The same reference numerals refer to the same elements throughout the specification.

When elements or layers are referred to as "on" or "above" of other elements or layers, it includes not only when directly above of the other elements or layers, but also other elements or other layers intervened in the middle. On the other hand, when elements are referred to as "directly on" or "directly above," it indicates that no other element or layer is intervened therebetween.

The spatially relative terms "below," "beneath," "lower," "above," "upper," etc., as shown in figures, can be used to easily describe the correlation of components or elements with other components or elements. The spatially relative terms should be understood as terms including the different direction of the element in use or operation in addition to the direction shown in the figure. For example, if the element shown in the figure is turned over, an element described as "below" or "beneath" the other element may be placed "above" the other element. Accordingly, the exemplary term "below" can include both the directions of below and above. The element can also be oriented in other directions, so that spatially relative terms can be interpreted according to the orientation.

Although the first, second, etc. are used to describe various components, elements and/or sections, these components, elements and/or sections are not limited by these terms. These terms are only used to distinguish one component, element, or section from another component, element or section. Therefore, first component, the first element or first section mentioned below may be a second component, second element, or second section within the technical spirit of the present invention.

The terminology used herein is for describing the embodiments and is not intended to limit the present invention. In the present specification, the singular form also includes the plural form unless otherwise specified in the phrase. As used herein, "comprises" and/or "comprising" means that the elements, steps, operations and/or components mentioned above do not exclude the presence or additions of one or more other elements, steps, operations and/or components.

Unless otherwise defined, all terms (including technical and scientific terms) used in the present description may be used with meanings that can be commonly understood by those of ordinary skill in the art to which the present invention belongs. In addition, terms defined in a commonly used dictionary are not interpreted ideally or excessively unless explicitly defined specifically.

Hereinafter, exemplary embodiments of the present invention will be described in detail with reference to the accompanying drawings, and in the description with reference to the accompanying drawings, the same or corresponding elements are assigned the same reference numbers regardless of reference numerals, and the description overlapped therewith will be omitted.

Figure 2:
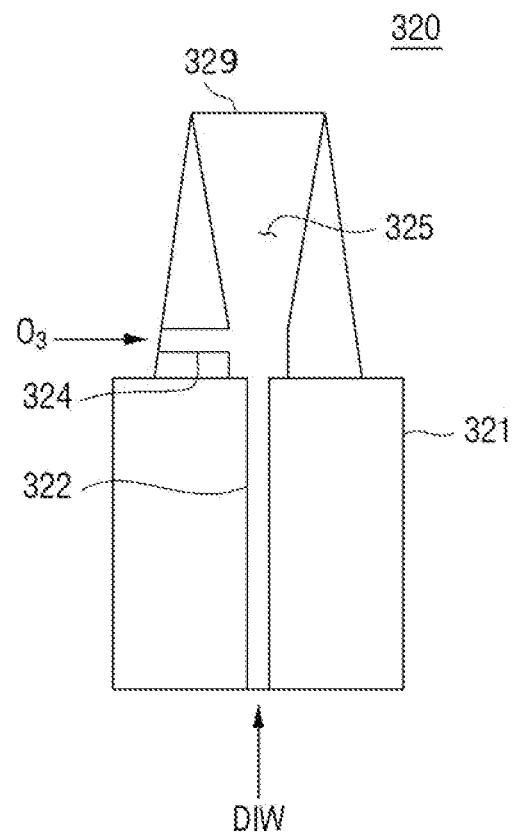
FIG. 2 is a view for describing an example of the nozzle of FIG. 1.

FIG. 1 is a conceptual diagram for describing a substrate processing apparatus according to a first embodiment of the present invention. FIG. 2 is a view for describing an example of the nozzle of FIG. 1.

Referring to FIG. 1, the substrate processing apparatus 1 according to the first embodiment of the present invention includes a support module 10 and a fluid supply module 30.

A pin 12 for supporting the substrate W is installed on the surface of the support module 10. The pin 12 may be, for example, a chucking pin that supports the side surface of the substrate W, or a support pin that supports one surface (i.e., an upper surface) of the substrate W.

On the support module 10, the substrate W is inverted and seated. That is, one surface (i.e., the surface or the upper surface) US of the inverted substrate W faces the support module 10. As shown, a material layer PT is formed on one surface US of the substrate W. The material layer PT may be a photoresist pattern, but is not limited thereto. The material layer PT may be an inorganic material layer (e.g., $SiO_2$, SiN, or SiON), in which an organic residue remains. The substrate processing apparatus 1 according to the first embodiment of the present invention may remove a photoresist pattern (i.e., a strip process) or remove organic residues remaining on the inorganic material layer/substrate.

In addition, an ultraviolet light source 15 is installed in the support module 10. The ultraviolet light source 15 irradiates ultraviolet rays to one surface US of the inverted substrate W. Ultraviolet rays may photolyze the photoresist pattern. In addition, ultraviolet rays may activate radical generation of ozone water ($O_3DIW$), which will be described later.

The fluid supply module 30 supplies a fluid (e.g., ozone water ($O_3DIW$)) to one surface US of the inverted substrate W. Here, ozone water means a mixed fluid including ozone ($O_3$) and pure/deionized water (DIW), and ozone may be used in a mixed (or dissolved) state in deionized water. If desired, nitrogen and/or carbon dioxide may be added to the fluid as catalyst gases. Nitrogen and carbon dioxide are for maintaining the ozone concentration of the ozone treatment fluid at a high concentration. Nitrogen acts as a catalyst for decomposition of $O_2$ into O, and carbon dioxide inhibits the decomposition of $O_3$ into $O_2$.

The fluid supply module 30 may include a nozzle 320 installed in the support module 10, a first storage unit 310a for supplying pure water (DIW) to the nozzle 320, and a second storage unit 310b for supplying ozone ($O_3$) to the nozzle 320.

Referring to FIG. 2, the nozzle 320 for discharging ozone water ($O_3DIW$) to one surface US of the substrate W may include the mixing space 325 and the discharge port 329 formed in the body 321. Pure water (DIW) is provided from the first storage unit 310a to the mixing space 325 through the inlet passage 322. In addition, ozone ($O_3$) is provided from the second storage unit 310b to the mixing space 325 through the ozone inlet passage 324. Pure water (DIW) and ozone ($O_3$) come into contact in the mixing space 325, and ozone is dissolved in the pure water. The high concentration ozone water generated in the mixing space 325 is discharged to one surface US of the substrate W through the discharge port 329. As described above, ozone water is produced by the nozzle 320 and discharged to the substrate W, so that ozone can react on the substrate W before decomposition. The method for generating ozone water is not limited to that described with reference to FIG. 2. Any method, in which ozone can react on the surface US of the substrate W, is possible.

In summary, the inverted substrate W is seated on the support module 1, ozone water ($O_3DIW$) is supplied using the nozzle 320 installed on the support module 10, and ultraviolet rays are supplied using an ultraviolet light source 15 installed on the support module 10. Since ozone water ($O_3DIW$) is supplied to a limited space (i.e., between the substrate W and the support module 10), the amount of ozone water used can be minimized.

In addition, a down flow is formed in the chamber, and the more the ozone water comes into contact with the down flow, the lower the concentration of the ozone water. However, in the substrate processing apparatus 1 according to some embodiments of the present invention, since ozone water is discharged between the substrate W and the support module 10, the amount of contact between the ozone water and the down flow is minimized. Accordingly, it is possible to prevent a decrease in the concentration of ozone water.

In addition, since ultraviolet rays are irradiated in a limited space (i.e., between the substrate W and the support module 10), the efficiency of generating radicals of the ozone water ($O_3$DIW) can be increased. In addition, the photolysis efficiency of the photoresist pattern can be increased.

Figure 3:
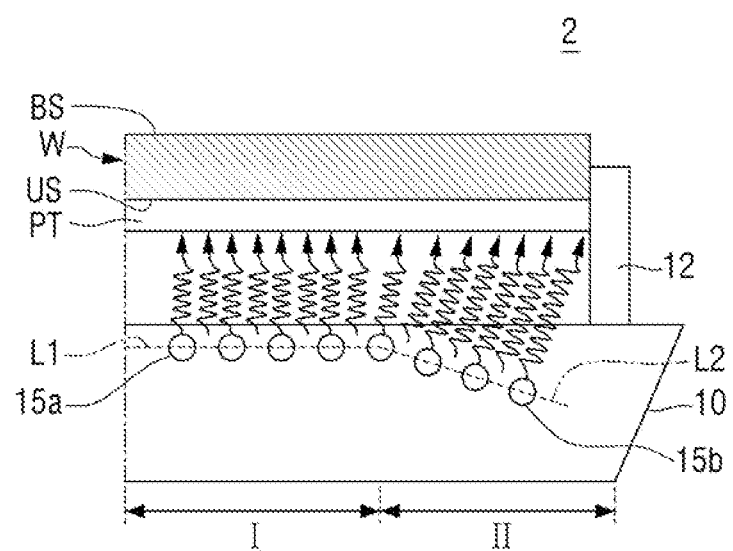
FIG. 3 is a conceptual diagram for describing a substrate processing apparatus according to a second embodiment of the present invention.

FIG. 3 is a conceptual diagram for describing a substrate processing apparatus according to a second embodiment of the present invention. For convenience of description, the points different from those described with reference to FIGS. 1 and 2 will be mainly described.

Referring to FIG. 3, in the substrate processing apparatus 2 according to the second embodiment of the present invention, the ultraviolet light sources 15a and 15b include the first ultraviolet light source 15a arranged in the central area I of the support module 10 and the second ultraviolet light source 15b arranged in the edge area II of the support module 10.

Here, the first ultraviolet light source 15a may irradiate ultraviolet rays in a first direction (e.g., a vertical direction) toward the substrate W, and the second ultraviolet light source 15b may irradiate ultraviolet rays in a second direction different from the first direction (e.g., in a diagonal direction). As shown in FIG. 3, the first ultraviolet light source 15a may be installed on a first plane L1 parallel to the surface of the support module 10, and the second ultraviolet light source 15b may be installed on the second plane L2 intersecting the first plane L1 at an acute angle.

When the ultraviolet light source installed in the support module 10 irradiates ultraviolet rays only in the vertical direction, the ultraviolet rays may not be well irradiated to the edge area of the substrate W. Accordingly, the second ultraviolet light source 15b is arranged so that the second ultraviolet light source 15b arranged in the edge area II of the support module 10 can irradiate the ultraviolet rays toward the edge area of the substrate W. In this way, the processing uniformity of the entire substrate W can be increased.

Figure 4:
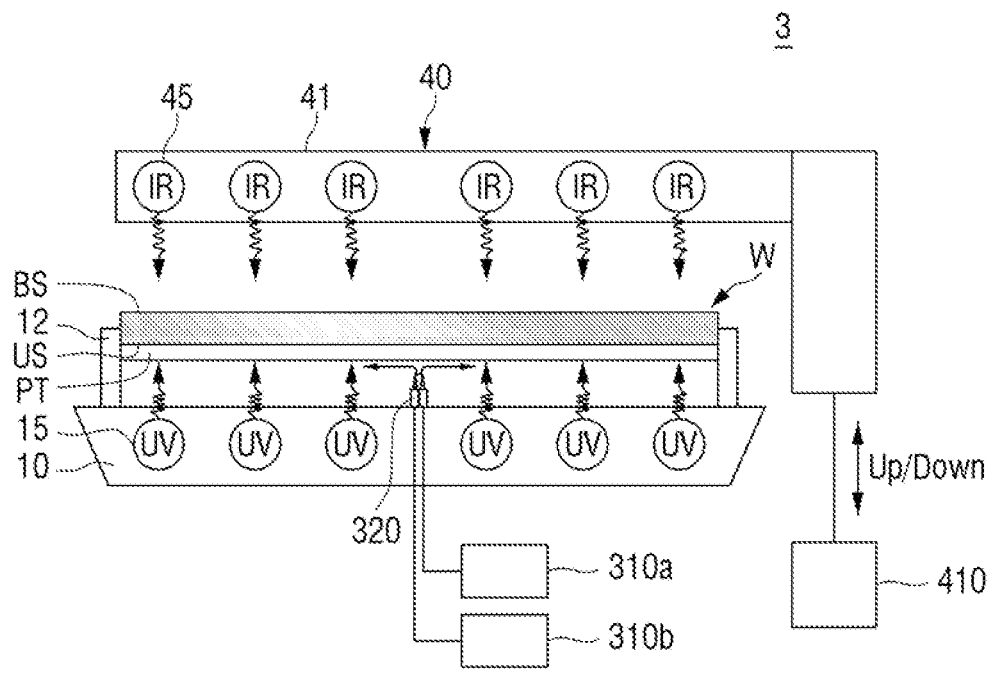
FIG. 4 is a conceptual diagram for describing a substrate processing apparatus according to a third embodiment of the present invention.

FIG. 4 is a conceptual diagram for describing a substrate processing apparatus according to a third embodiment of the present invention. For convenience of description, the points different from those described with reference to FIGS. 1 to 3 will be mainly described.

Referring to FIG. 4, the substrate processing apparatus 3 according to the third embodiment of the present invention may further include a heating module 40.

The heating module 40 may be arranged to be spaced apart from the support module 10 in an upward direction, and may control the temperature of the substrate W seated on the support module 10. For example, the heating module 40 may increase the temperature of the substrate W by irradiating infrared rays to the rear surface BS of the substrate W.

For example, when the temperature of the substrate W is increased by providing hot pure water DIW to the rear surface BS of the substrate W, the substrate W is heated below the boiling point. That is, the temperature, at which the substrate W is heated, is limited to below the boiling point. On the other hand, when the substrate W is heated using the infrared light source 45, the substrate W can be sufficiently heated without the aforementioned temperature limitation. Accordingly, the reactivity between the substrate W and the ozone water can be sufficiently increased.

The heating module 40 may include a body 41, an infrared light source 45 installed in the body 41, and a driving unit 410 for moving the body 41 in the vertical direction. The body 41 may have a substantially disk shape similar to the substrate W, but is not limited thereto. In order to control the heating temperature of the substrate W, the output provided to the infrared light source 45 may be adjusted, and the distance between the substrate W and the body 41 may be adjusted.

Meanwhile, the body 41 may have a bar shape. In this case, the body 41 may swing on the substrate W during the process to heat the substrate W as a whole.

Figure 5:
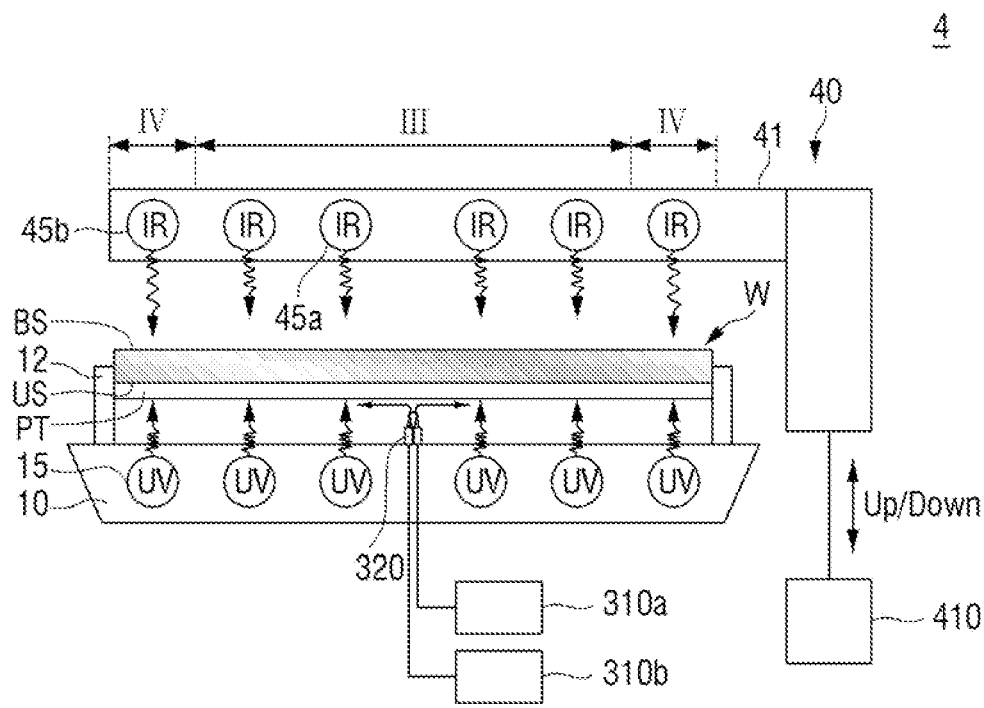
FIG. 5 is a conceptual diagram for describing a substrate processing apparatus according to a fourth embodiment of the present invention.

FIG. 5 is a conceptual diagram for describing a substrate processing apparatus according to a fourth embodiment of the present invention. For convenience of description, the points different from those described with reference to FIGS. 1 to 4 will be mainly described.

Referring to FIG. 5, in the substrate processing apparatus 4 according to the fourth embodiment of the present invention, the body 41 includes a first area III and a second area IV surrounding the first area III. Alternatively, the first area III may correspond to a center area of the substrate W, and the second area IV may correspond to an edge area of the substrate W. The first infrared light source 45a is formed in the first area III, and the second infrared light source 45b is formed in the second area IV.

Here, the output of the first infrared light source 45a and the output of the second infrared light source 45b may be controlled differently. The output of the second infrared light source 45b may be greater than that of the first infrared light source 45a.

Substrate processing efficiency may be lower in the edge area of the substrate W than in the center area of the substrate W. Accordingly, by increasing the temperature of the edge area of the substrate W compared to the temperature of the center area, the processing uniformity of the substrate W as a whole can be increased. To this end, the output of the second infrared light source 45b corresponding to the edge area of the substrate W may be controlled to be greater than the output of the first infrared light source 45a corresponding to the center area of the substrate W.

Figure 6:
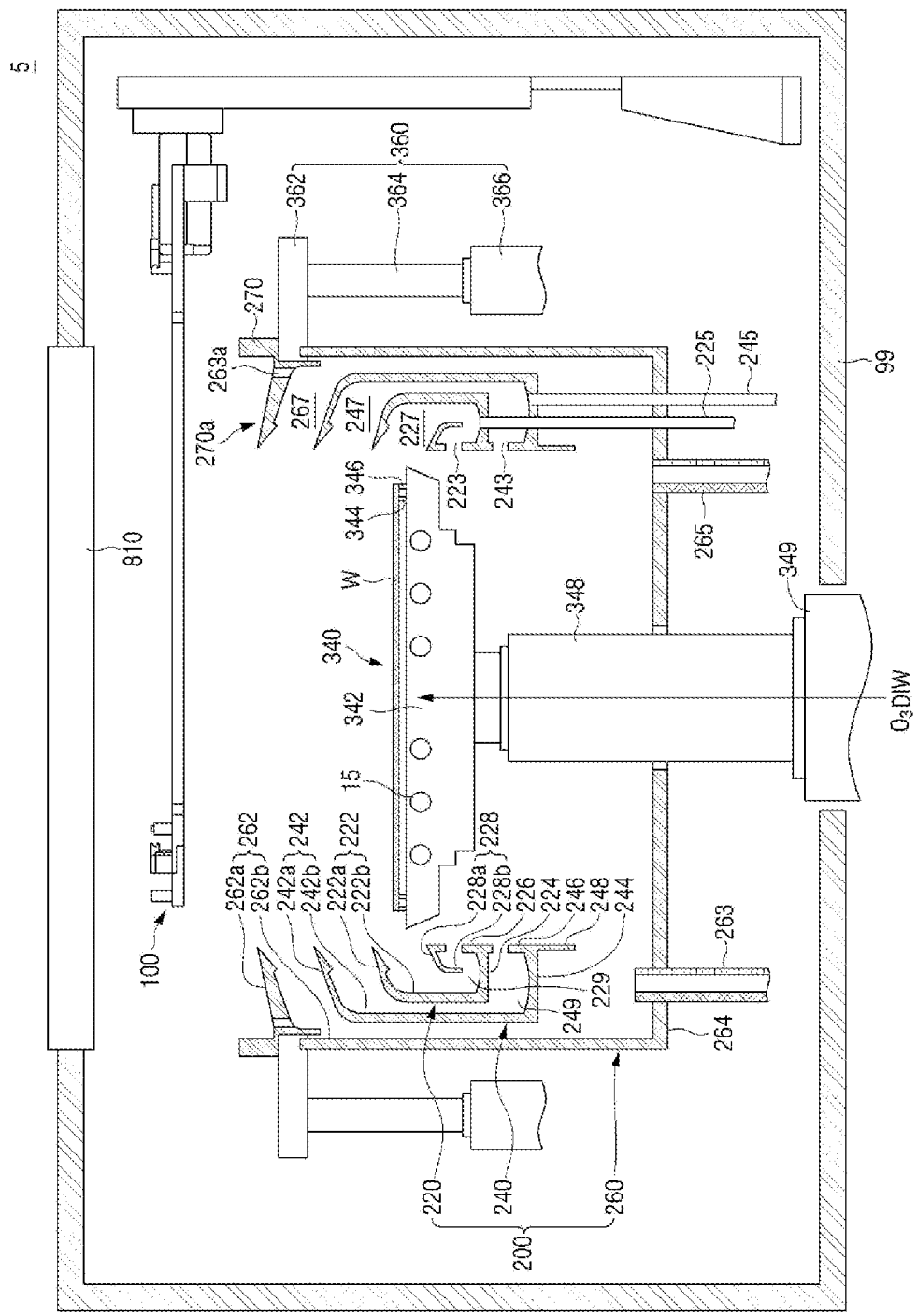
FIG. 6 is a conceptual diagram for describing a substrate processing apparatus according to a fifth embodiment of the present invention.
Figure 7:
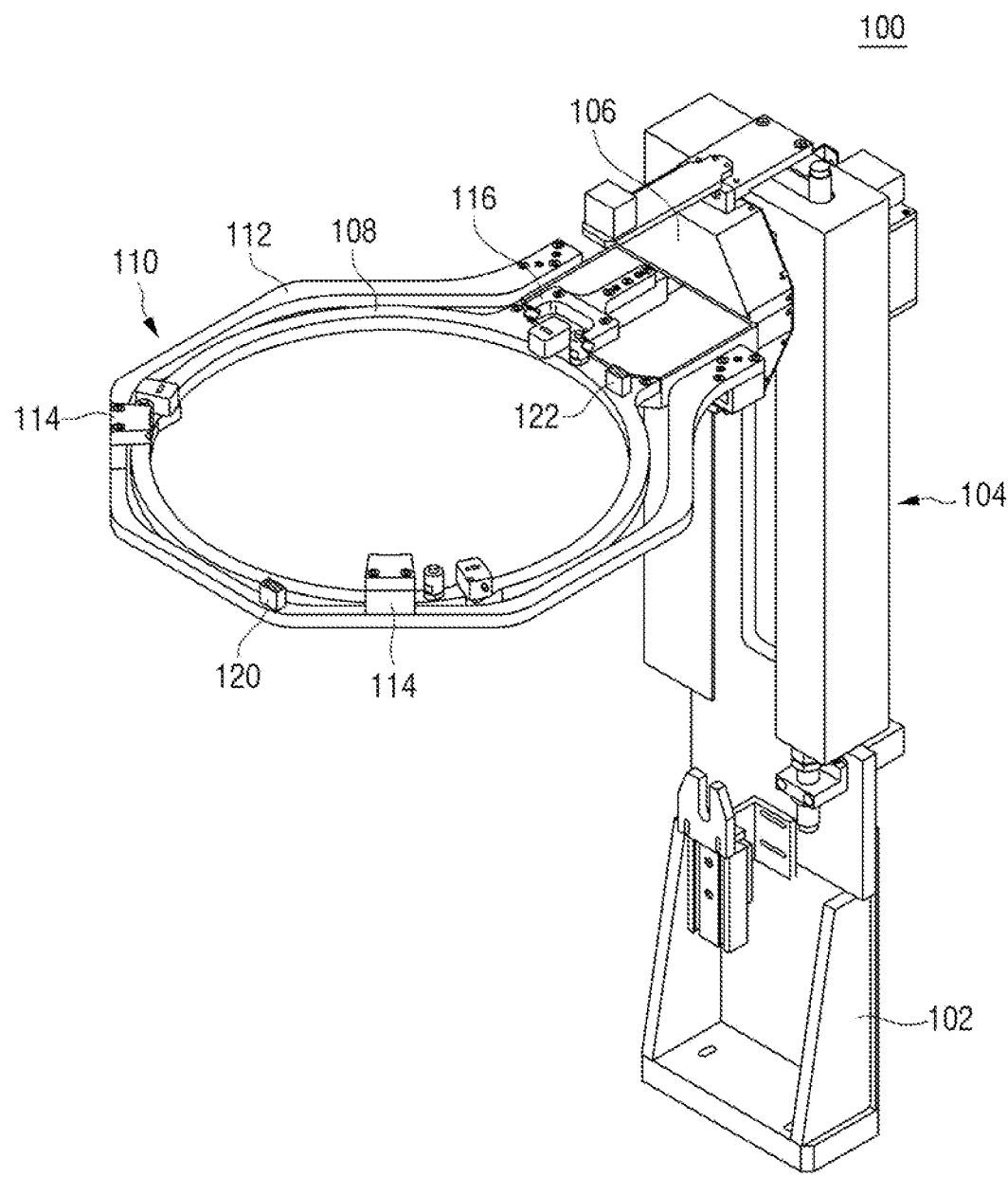
FIG. 7 is a perspective view for describing the inversion module of FIG. 6.

FIG. 6 is a conceptual diagram for describing a substrate processing apparatus according to a fifth embodiment of the present invention. FIG. 7 is a perspective view for describing the inversion module of FIG. 6. An embodiment of the substrate processing apparatus described with reference to FIGS. 1 to 3 is shown. For convenience of description, the points different from those described with reference to FIGS. 1 to 3 will be mainly described.

Referring to FIGS. 6 and 7, the substrate processing apparatus 5 according to the fifth embodiment of the present invention includes a chamber 99, a housing 200, a support module 340, an elevating module 360, an inversion module 100, and a fluid supply module (not shown).

The housing 200 provides a processing space, in which a process is performed, and an upper central portion thereof is opened. The housing 200 includes a plurality of bowls 220, 240, 260. According to one example, the housing 200 includes an inner bowl (or a third bowl or a three-stage bowl) 220, an intermediate bowl (or a second bowl or a two-stage bowl) 240, and an outer bowl (or, a first bowl or a single-stage bowl) 260. The inner bowl 220, the intermediate bowl 240, and the outer bowl 260 may separate and recover different chemical solutions from among the chemical solutions used in the process. The inner bowl 220 is provided in a hollow cylindrical shape surrounding the support module 340, the intermediate bowl 240 is provided in a hollow cylindrical shape surrounding the inner bowl 220, and the outer bowl 260 is provided in a hollow cylindrical shape surrounding the intermediate bowl 240. That is, the intermediate bowl 240 may be arranged inside the outer bowl 260, and the inner bowl 220 may be arranged inside the intermediate bowl 240. The inner space of the inner bowl 220, the space between the inner bowl 220 and the intermediate bowl 240, and the space between the intermediate bowl 240 and the outer bowl 260 respectively function as an inlet, through which the chemical solution flows into the inner bowl 220, the intermediate bowl 240, and the outer bowl 260. The inner bowl 220, the intermediate bowl 240, and the outer bowl 260 are respectively connected to recovery lines 225, 245, 265 extending vertically in the direction below the bottom surface. Each of the recovery lines 225, 245, 265 discharges the chemical solution introduced through each of the inner bowl 220, the intermediate bowl 240, and the outer bowl 260. The discharged chemical solution may be reused through an external chemical solution recovery system (not shown).

Next, the shapes of the inner bowl 220, the intermediate bowl 240, and the outer bowl 260 will be described in more detail.

The inner bowl 220 has an outer wall 222, a bottom wall 224, an inner wall 226, and a guide wall 228. Each of the outer wall 222, the bottom wall 224, the inner wall 226, and the guide wall 228 has a ring shape. The outer wall 222 has an inclined wall 222a inclined downward in a direction away from the support module 340 and a vertical wall 222b vertically extending in a downward direction from a lower end thereof. The bottom wall 224 extends horizontally from the lower end of the vertical wall 222b toward the support module 340. The end of the bottom wall 224 extends to the same position as the upper end of the inclined wall 222a. The inner wall 226 extends vertically upward from the inner end of the bottom wall 224. The inner wall 226 extends to a position such that its upper end is spaced apart from the upper end of the inclined wall 222a by a predetermined distance. The space spaced apart in the vertical direction between the inner wall 226 and the inclined wall 222a functions as the inlet 227 of the inner bowl 220 described above.

A plurality of openings 223 are formed in the inner wall 226 in a ring arrangement. Each of the openings 223 is provided in a slit shape. The opening 223 functions as an exhaust port, through which the gases introduced into the inner bowl 220 are discharged to the outside through the space below the support module 340.

The guide wall 228 has an inclined wall 228a that is inclined downward in a direction away from the support module 340 from the upper end of the inner wall 226 and a vertical wall 228b that extends vertically downwardly from the lower end thereof. The lower end of the vertical wall 228b is located to be spaced apart from the bottom wall 224 by a predetermined distance. The guide wall 228 guides the chemical solution introduced through the inlet 227 to flow smoothly into the space 229 surrounded by the outer wall 222, the bottom wall 224, and the inner wall 226.

The intermediate bowl 240 has an outer wall 242, a bottom wall 244, an inner wall 246, and a protruding wall 248. The outer wall 242, the bottom wall 244, and the inner wall 246 of the intermediate bowl 240 have a shape substantially similar to the outer wall 222, the bottom wall 224, and the inner wall 226 of the inner bowl 220. However, the intermediate bowl 240 has a larger size than the inner bowl 220 so as to surround the inner bowl 220. The upper end of the inclined wall 242a of the outer wall 242 of the intermediate bowl 240 and the upper end of the inclined wall 222a of the outer wall 222 of the inner bowl 220 are spaced apart from each other by a predetermined distance in the vertical direction. The spaced space functions as the inlet 247 of the intermediate bowl 240. The protruding wall 248 extends vertically in a downward direction from the end of the bottom wall 244. The upper end of the inner wall 246 of the intermediate bowl 240 is in contact with the end of the bottom wall 224 of the inner bowl 220. Slit-shaped exhaust ports 243 for discharging gas are provided on the inner wall 246 of the intermediate bowl 240 in a ring arrangement.

The outer bowl 260 has an outer wall 262, a bottom wall 264, and a protruding wall 270. The outer wall 262 of the outer bowl 260 has a shape similar to the outer wall 242 of the intermediate bowl 240, but has a larger size than the intermediate bowl 240 so that the outer bowl 260 surrounds the intermediate bowl 240. The inclined wall 262a of the outer bowl 260 extends from the upper end of the vertical wall 262b to be inclined upward along the inward direction. The inclined wall 262a is provided as an upper wall of the housing having an open center. A discharge hole 263a is formed in the inclined wall 262a of the outer bowl 260. The discharge hole 263a is located adjacent to the vertical wall. A plurality of discharge holes 263a are provided. Each discharge hole 263a may be formed along the circumferential direction of the inclined wall 262a. The plurality of discharge holes 263a may be provided in combination with each other to have an annular ring shape. The protruding wall 270 is provided to protrude upward from the upper end of the vertical wall 262b. The protruding wall 270 is provided in an annular ring shape having the same diameter as the vertical wall 262b. The protruding wall 270 and the inclined wall 262a are combined with each other to form a liquid storage space 270a. The liquid storage space 270a is provided to communicate with the inner space of the outer bowl 220 through the discharge hole 263a. The upper end of the inclined wall 262a of the outer bowl 260 and the upper end of the inclined wall 242b of the intermediate bowl 240 are located to be spaced apart by a predetermined distance in the vertical direction, and the spaced space functions as the inlet 267 of the outer bowl 260. The bottom wall 264 has a substantially disk shape, and an opening, into which the support shaft (rotation shaft) 348 is inserted, is formed in the center. The outer bowl 260 functions as an outer wall of the entire housing 200.

The support module 340 supports the substrate W in the processing space of the housing 200 and rotates the substrate W. The support module 340 includes an ultraviolet light source 15, a body 342, a support pin 344, a chucking pin 346, and a support shaft (or rotation shaft) 348. The body 342 has an upper surface that is provided as a substantially circular shape when viewed from above. A support shaft 348 rotatable by a motor 349 is fixedly coupled to the bottom surface of the body 342.

A plurality of support pins 344 are provided. The support pins 344 are arranged to be spaced apart from each other at a predetermined interval in the edge of the upper surface of the body 342 and protrude upward from the body 342. The support pins 344 are arranged to have an annular ring shape as a whole by combination with each other. The support pin 344 supports the rear edge of the substrate W so that the substrate W is spaced apart from the upper surface of the body 342 by a predetermined distance.

A plurality of chucking pins 346 are provided. The chucking pin 346 is arranged farther from the center of the body 342 than the support pin 34. The chucking pin 346 is provided to protrude upward from the body 342. The chucking pin 346 supports the side of the substrate W so that the substrate W is not laterally separated from the proper position when the support module 340 is rotated. The chucking pin 346 is provided to enable linear movement between the standby position and the support position along the radial direction of the body 342. The standby position is a position farther from the center of the body 342 than the support position. When the substrate W is loaded or unloaded from the support module 340, the chucking pin 346 is located at the standby position, and when the process is performed on the substrate W, the chucking pin 346 is located at the support position. In the support position, the chucking pin 346 is in contact with the side of the substrate W.

In the support module 340, an ultraviolet light source 15 is installed. The ultraviolet light source 15 irradiates ultraviolet rays on one surface of the inverted substrate W. Ultraviolet rays can photolyze the photoresist pattern. In addition, ultraviolet rays may activate radical generation of ozone water ($O_3DIW$), which will be described later.

The elevating module 360 may linearly move the housing 200 in the vertical direction. As the housing 200 moves up and down, the relative height of the housing 200 with respect to the support module 340 is changed.

The elevating module 360 has a bracket 362, a moving shaft 364, and a driving unit 366. The bracket 362 is fixedly installed on the outer wall 262 of the housing 200, and a moving shaft 364 that is moved in the vertical direction by the driving unit 366 is fixedly coupled to the bracket 362. When the substrate W is placed on or lifted from the support module 340, the housing 200 descends so that the support module 340 protrudes above the housing 200. In addition, during the process, the height of the housing 200 is adjusted so that the chemical solution can be introduced into the predetermined bowls 220, 240, 260 according to the type of the chemical solution supplied to the substrate W. Contrary to the above, the elevating module 360 may move the support module 340 in the vertical direction.

As shown in FIG. 7, the inversion module 100 includes a handler 110 that inverts the substrate W, sensors 120 and 122 for emitting and receiving at least one optical signal SENSE1 and SENSE2 in the horizontal direction with the substrate W to detect the seating state of the substrate W seated on the handler 110, a driving unit 104 for rotating or moving the handler 110 up and down, and a control unit (not shown) for determining the normal or abnormal seating state of the substrate W through the optical signal detected from the sensors 120 and 122.

As shown, the handler 110 includes a buffer 108, on which the substrate W is seated, and the chucking arm 112 including chucking blocks 114 and 116 at a plurality of positions for chucking the substrate W seated on the buffer 108 and a head 106 for driving the chucking arm 112 to chuck the substrate W seated on the buffer 108 by coupling to one side of the chucking arm 112 and the buffer 108.

The driving unit 104 is provided with, for example, a guide, a guide rail, a motor, a cylinder, a cam, a gear, a belt, and a pulley to rotate and move the head 106 so that the handler 110 is rotated or the handler 110 is slid up and down. The driving unit 104 rotates the head 106 to invert the handler 110, and moves the handler 110 to load the substrate W into the substrate support unit or unload the substrate W from the substrate support unit. In addition, the driving unit 104 includes a support frame 102 installed on the lower base frame (not shown) for fixing the inversion module 100 inside the chamber.

The sensors 120 and 122 include a light emitting unit 120 that generates at least one optical signal SENSE1 and SENSE2 and a light receiving unit 122 that receives the respective optical signals SENSE1 and SENSE2 in response to the light emitting unit 120, and the light emitting unit 120 and the light receiving unit 122 are installed on the chucking arm 112 to face each other. Accordingly, the sensors 120 and 122 emit and receive the optical signals SENSE1 and SENSE2 horizontally with the substrate W seated on the buffer 108. To this end, the light emitting unit 120 includes at least one light emitting element (not shown) that generates at least one optical signal SENSE1 and SENSE2, and the light receiving unit 122 includes at least one light receiving element (not shown) that receives at least one optical signal SENSE1 and SENSE2. For example, the light emitting unit 120 maintains a predetermined distance (e.g., less than 1 mm) from the lower surface of the substrate W (i.e., the front surface of the wafer) seated on the buffer 108 to generate one optical signal SENSE1 horizontally. As another example, the light emitting unit 120 maintains a predetermined distance (e.g., less than 1 mm) from various positions, i.e., from the upper surface and the lower surface of the substrate W seated on the buffer 108 to generate a plurality of the optical signals SENSE1 and SENSE2 horizontally. Therefore, the sensors 120 and 122 emit and receive the optical signals SENSE1 and SENSE2 from the side of the substrate W, thereby accurately detecting whether the substrate W seated on the buffer 108 is in a normal state or an abnormal state.

Referring back to FIG. 6, the fluid supply module (not shown) may include a nozzle installed in the body 342 of the support module 10, a first storage unit for supplying pure water (DIW) to the nozzle, and a second storage unit for supplying ozone ($O_3$) to the nozzle as described above. In the mixing space in the nozzle, ozone water, in which ozone is dissolved by pure water, is discharged to one surface of the inverted substrate W.

In addition, the chamber 99 provides a sealed inner space. An airflow supply module 810 is installed at the upper portion. The airflow supply module 810 forms a down flow in the chamber 800. The airflow supply module 810 filters high-humidity outside air and supplies it to the inside of the chamber. The high-humidity outside air passes through the airflow supply module 810 and is supplied to the inside of the chamber to form a down flow. The down flow provides a uniform airflow to the upper portion of the substrate W, and discharges contaminants generated while the surface of the substrate W is processed by the processing fluid together with air to the process exhaust port through the bowls 220, 240, and 260 of the housing 200.

As described above, the more the ozone water ($O_3DIW$) comes into contact with the down flow, the lower the concentration of the ozone water. However, in the substrate processing apparatus 5 according to some embodiments of the present invention, since ozone water is discharged between the substrate W and the support module 340, the contact amount between the ozone water and the down flow is minimized. Accordingly, it is possible to prevent a decrease in the concentration of ozone water.

The inverted substrate W is seated on the support module 10, ozone water ($O_3DIW$) is supplied using the nozzle 320 installed on the support module 340, and ultraviolet rays are supplied using the ultraviolet light source 15 installed on the support module 340. Since ozone water ($O_3DIW$) is supplied to a limited space (i.e., between the substrate W and the support module 340), the amount of ozone water used can be minimized.

Figure 8:
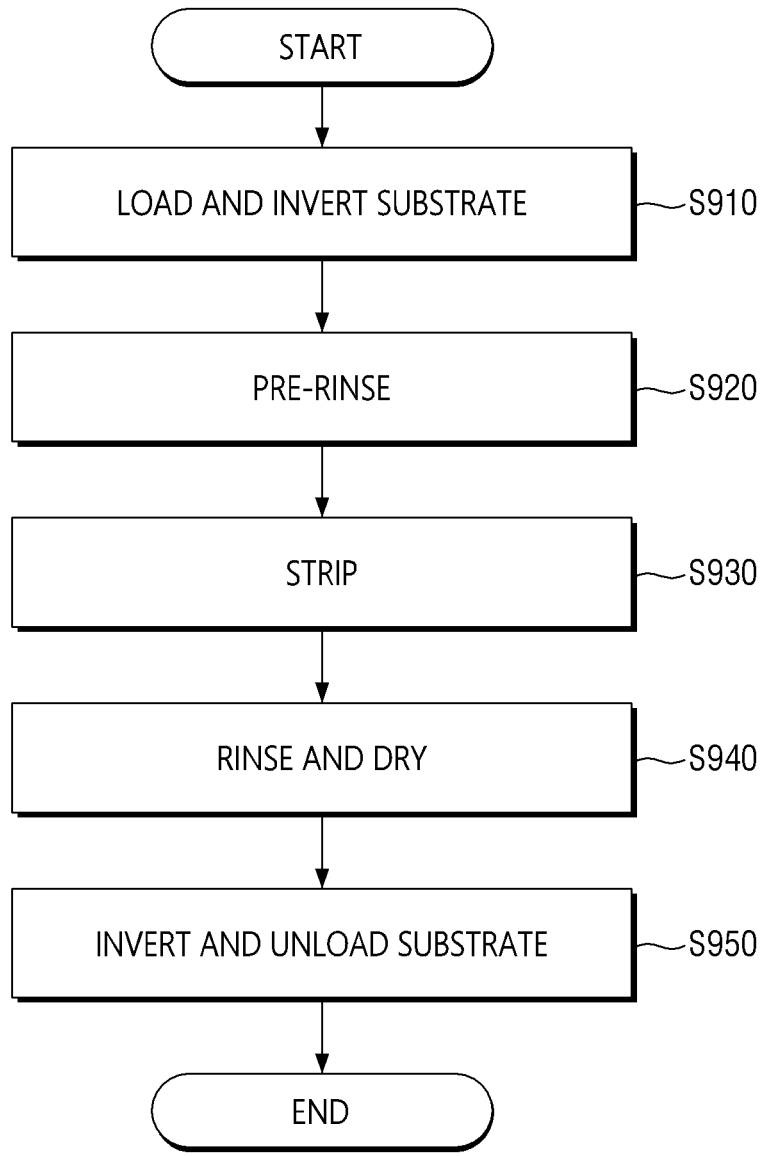
FIG. 8 is a flowchart for describing a substrate processing method according to an embodiment of the present invention.

FIG. 8 is a flowchart for describing a substrate processing method according to an embodiment of the present invention. An exemplary method of driving the substrate processing apparatus of FIG. 4 will be described.

Referring to FIGS. 4 and 8, the transfer module transfers the substrate W to the inversion module (see 100 in FIG. 6). The inversion module inverts the substrate W so that one surface faces the support module 10, and loads the inverted substrate W on the support module 10 (S910).

Next, the inverted substrate W is pre-rinsed (S920). For example, it can be rinsed using deionized water (DIW).

Next, the material layer (i.e., photoresist pattern) PT formed on the inverted substrate W is stripped (S930). Specifically, an infrared light source 45 is used to heat the substrate W, and the fluid supply module 30 supplies ozone water ($O_3DIW$) to one surface of the substrate W, and the ultraviolet light source 15 is used to photolyze the material layer PT and activate the radical generation of ozone water.

Subsequently, the substrate W, on which the strip process is completed, is rinsed (post-rinse) and dried (S940). For example, the substrate W may be rinsed using deionized water (DIW), and dried using $N_2$ gas.

Then, the inversion module 100 inverts the inverted substrate W again so that one surface of the substrate W faces upward (that is, the rear surface of the substrate W faces the support module 10), and the transfer module unloads the substrate W from the inversion module 100.

Figure 9:
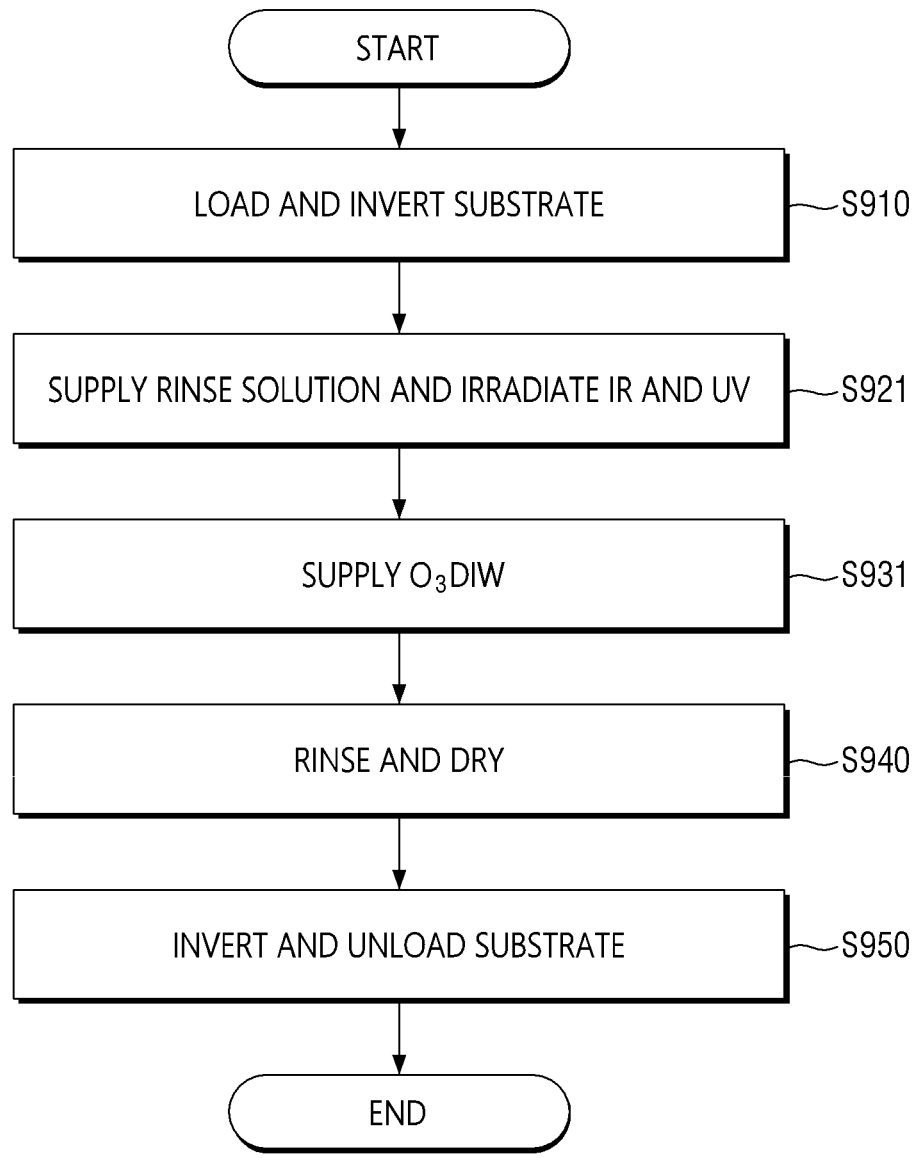
FIG. 9 is a flowchart for describing a substrate processing method according to another embodiment of the present invention.

FIG. 9 is a flowchart for describing a substrate processing method according to another embodiment of the present invention. An exemplary method of driving the substrate processing apparatus of FIG. 4 will be described. For convenience of description, the points different from those described with reference to FIG. 8 will be mainly described.

Referring to FIGS. 4 and 9, the substrate W is inverted so that one surface faces the support module 10, and the inverted substrate W is loaded on the support module 10 (S910).

Subsequently, the inverted substrate W is pre-rinsed, the infrared light source 45 starts to irradiate infrared rays, and the ultraviolet light source 15 starts to irradiate ultraviolet rays (S921).

Subsequently, the fluid supply module 30 supplies ozone water ($O_3DIW$) to one surface of the substrate W to strip the material layer (i.e., photoresist pattern) PT formed on the inverted substrate W (S931).

Subsequently, the substrate W, in which the strip process is completed, is rinsed (post-rinse) and dried (S940).

Then, the substrate W is inverted again so that one surface of the substrate W faces upward, and the transfer module unloads the substrate W.

Although the embodiments of the present invention have been described with reference to the above and the accompanying drawings, those of ordinary skill in the art to which the present invention pertains can understand that the present invention can be practiced in other specific forms without changing its technical spirit or essential features. Therefore, it should be understood that the embodiments described above are illustrative in all respects and not limiting.

What is claimed is:

1. An apparatus for processing a substrate comprising:
a support module, in which a substrate is inverted and seated, and an ultraviolet light source is installed, wherein the substrate is arranged so that one surface of the substrate faces the support module, and the ultraviolet light source irradiates ultraviolet rays to the one surface of the substrate;
a nozzle installed in the support module, wherein the substrate is arranged so that the one surface of the substrate faces the nozzle; and
a fluid supply module for supplying a fluid to the one surface of the substrate through the nozzle.

2. The apparatus of claim 1 further comprising:
a heating module arranged to be spaced apart from the support module in an upward direction and for controlling a temperature of a substrate seated on the support module.

3. The apparatus of claim 2, wherein the heating module includes an infrared light source for irradiating infrared rays to a rear surface of the substrate.

4. The apparatus of claim 3, wherein the heating module comprises a body including a first area and a second area surrounding the first area, a first infrared light source formed in the first area, and a second infrared light source formed in the second area, and
wherein an output of the first infrared light source and an output of the second infrared light source are controlled differently.

5. The apparatus of claim 4, wherein an output of the second infrared light source is greater than an output of the first infrared light source.

6. The apparatus of claim 1, wherein the ultraviolet light source comprises a first ultraviolet light source arranged in a central area of the support module and a second ultraviolet light source arranged in an edge area of the support module, and
wherein the first ultraviolet light source irradiates ultraviolet rays in a first direction toward the substrate, and the second ultraviolet light source irradiates ultraviolet rays in a second direction different from the first direction.

7. The apparatus of claim 1 further comprises an inversion module for inverting the substrate.

8. The apparatus of claim 7, wherein the inversion module provides the substrate to the support module after inverting the substrate provided from an outside of a chamber so that the one surface of the substrate faces the support module, and inverts the substrate processed by the fluid and the ultraviolet rays again so that a rear surface of the substrate faces the support module.

9. The apparatus of claim 1, wherein a photoresist pattern is formed on the one surface of the substrate, and the fluid includes ozone water.

10. The apparatus of claim 1, wherein the support module further comprises an airflow supply module installed in a chamber and for forming a down flow in the chamber.

11. An apparatus for processing a substrate comprising:
a chamber;
an inversion module installed in the chamber and for inverting a substrate;
a support module installed in the chamber, in which a substrate inverted by the inversion module is seated, and an ultraviolet light source is installed, wherein one surface of the inverted substrate faces the support module, and the ultraviolet light source irradiates ultraviolet rays to the one surface of the inverted substrate;
a fluid supply module including a nozzle installed in the support module and for supplying a fluid to the one surface of the inverted substrate through the nozzle, wherein the one surface of the inverted substrate faces the nozzle; and
a heating module arranged to be spaced apart from the support module in an upward direction and including an infrared light source for irradiating infrared rays to a rear surface of the inverted substrate.

12. The apparatus of claim 11, wherein the heating module comprises a body including a first area and a second area surrounding the first area, a first infrared light source formed in the first area, and a second infrared light source formed in the second area, and wherein an output of the second infrared light source is controlled to be greater than an output of the first infrared light source.

13. The apparatus of claim 11, wherein the ultraviolet light source comprises a first ultraviolet light source arranged in a central area of the support module and a second ultraviolet light source arranged in an edge area of the support module, wherein the first ultraviolet light source irradiates ultraviolet rays in a first direction toward the substrate, and wherein the second ultraviolet light source irradiates ultraviolet rays in a second direction different from the first direction.

14. The apparatus of claim 11, wherein a photoresist pattern is formed on the one surface of the substrate, and the fluid includes ozone water.

15. The apparatus of claim 11 further comprises an airflow supply module for forming a down flow in the chamber.

16. A method for processing a substrate comprising:

inverting and seating a substrate on a support module in which an ultraviolet light source is installed, wherein the substrate is arranged so that one surface of the substrate faces the support module and the ultraviolet light source irradiates ultraviolet rays to the one surface of the substrate; and supplying a fluid to the one surface of the substrate with a nozzle installed in the support module while irradiating the ultraviolet rays to the one surface of the substrate to process the substrate, wherein the substrate is arranged so that the one surface of the substrate faces the nozzle.

17. The method of claim 16 further comprises heating the substrate by irradiating infrared rays to a rear surface of the substrate while processing the substrate.

18. The method of claim 17, wherein the substrate is divided into a center area and an edge area, and an amount of infrared rays irradiated to the center area and an amount of infrared rays irradiated to the edge area are different from each other.

19. The method of claim 16, wherein a photoresist pattern is formed on the one surface of the substrate, and the fluid includes ozone water.

20. The method of claim 16 further comprising forming a down flow in a chamber that processes the substrate during processing the substrate.

* * * * *